United States Patent
Yasunami et al.

(10) Patent No.: US 7,217,493 B2
(45) Date of Patent: May 15, 2007

(54) POSITIVE RESIST COMPOSITION

(75) Inventors: Shoichiro Yasunami, Shizuoka (JP); Kazuyoshi Mizutani, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 50 days.

(21) Appl. No.: 10/840,624

(22) Filed: May 7, 2004

(65) Prior Publication Data
US 2004/0229161 A1    Nov. 18, 2004

(30) Foreign Application Priority Data
May 12, 2003    (JP)    ................. P.2003-133194

(51) Int. Cl.
G03F 7/039    (2006.01)
G03F 7/075    (2006.01)

(52) U.S. Cl. .................... 430/270.1; 430/905; 430/914

(58) Field of Classification Search ............. 430/270.1, 430/905, 914
See application file for complete search history.

(56) References Cited

U.S. PATENT DOCUMENTS

| | | | | |
|---|---|---|---|---|
| 5,882,844 | A * | 3/1999 | Tsuchiya et al. | 430/288.1 |
| 6,296,985 | B1 * | 10/2001 | Mizutani et al. | 430/270.1 |
| 6,420,084 | B1 * | 7/2002 | Angelopoulos et al. | 430/270.1 |
| 6,531,260 | B2 * | 3/2003 | Iwasawa et al. | 430/270.1 |
| 6,589,705 | B1 * | 7/2003 | Sato et al. | 430/270.1 |
| 6,939,664 | B2 * | 9/2005 | Huang et al. | 430/270.1 |
| 2003/0170561 | A1 * | 9/2003 | Iwasawa et al. | 430/270.1 |
| 2005/0106494 | A1 * | 5/2005 | Huang et al. | 430/270.1 |

FOREIGN PATENT DOCUMENTS

| | | |
|---|---|---|
| JP | 6-184311 A | 7/1994 |
| JP | 8-160620 A | 6/1996 |
| JP | 9-274319 A | 10/1997 |
| JP | 2000-219743 A | 8/2000 |
| JP | 2001-109150 A | 4/2001 |
| JP | 2001-147538 A | 5/2001 |
| JP | 2001-330957 A | 11/2001 |
| JP | 2002-6494 A | 1/2002 |

OTHER PUBLICATIONS

Keiji Watanabe et al., "Study of Bi-level Resist System with Conductive Bottom Layer for EB lithography", Journal of Photopolymer Science and Technology, vol. 19, No. 4 (1996), pp. 697-706.

* cited by examiner

*Primary Examiner*—Richard L. Schilling
(74) *Attorney, Agent, or Firm*—Sughrue Mion, PLLC

(57) ABSTRACT

A positive resist composition comprising (A) polysiloxane or polysilsesquioxane that has a property of increasing solubility in an alkali developing solution by the action of an acid and contains a group capable of being decomposed with an acid, (B) a compound that generates a sulfonic acid upon irradiation of an actinic ray or radiation and (C) an organic basic compound, wherein an amount of the compound that generates a sulfonic acid upon irradiation of an actinic ray or radiation is from 6 to 20% by weight based on the total solid content of the positive resist composition.

8 Claims, No Drawings

POSITIVE RESIST COMPOSITION

FIELD OF THE INVENTION

The present invention relates to a positive resist composition suitably used for super-microlithographic processes, for example, the production of VLSI and high-capacity microchips, and other photofabrication processes. More specifically, the invention relates to a silicon-containing positive resist composition capable of forming highly fine patterns using an electron beam, an X ray or an EUV (extreme ultraviolet) beam and particularly to a positive resist composition, which can be suitably used for fine fabrication of semiconductor devices using an electron beam, an X ray or an EUV beam.

BACKGROUND OF THE INVENTION

In processes for the production of semiconductor devices, for example, IC or LSI, fine fabrication is conducted by means of lithography using a photoresist composition. In recent years, as the degree of integration in integrated circuits increases, it has been requested to form an ultra fine pattern in the submicron region or the quarter micron region. With such a trend, an exposure wavelength tends to become shorter, for example, from g-line to i-line and further to a KrF excimer laser beam. Moreover, the development of lithography using an electron beam, an X ray or an EUV beam also proceeds at present in addition to the use of an excimer laser beam.

However, as the degree of integration in integrated circuits increases as described above, resolution limit of a conventional monolayer resist becomes clear and a method of forming fine patterns having a large thickness by using a two-layer resist in place of the monolayer resist is proposed. Specifically, a thick layer of an organic polymer is formed as a lower layer, a thin resist material layer is formed as an upper layer on the lower layer, and then a high energy beam is irradiated to the upper resist material layer, followed by development. Thereafter, the lower organic polymer layer is subjected to oxygen plasma etching using the pattern thus-formed as a mask to prepare a pattern having a high aspect ratio. In such a case, since the upper resist layer must have high resistance to the oxygen plasma, a silicon-containing polymer is ordinarily used in the upper resist layer. Particularly, in order to increase the silicon content, many attempts to use an acid-decomposable group-containing polysiloxane or polysilsesquioxane that has silicon atoms in the main chain of the polymer have been made.

Particularly, with respect to lithography of next generation or after the next generation using an electron beam or an EUV beam, it has been strongly desired to increase sensitivity of resist for the purposes of reducing a processing time of wafer and decreasing damage to an apparatus. However, when high sensitivity is tried to pursue with respect to a positive resist, not only decrease in resolution but also deterioration of line edge roughness occur. Thus, development of resist that satisfies these characteristics at the same time has been strongly required. The term "line edge roughness" as used herein means a phenomenon wherein an edge between a line pattern of resist and a surface of substrate irregularly fluctuates in the direction vertical to the line due to the characteristics of resist, and the edge looks uneven when the pattern is observed from just above. Since the unevenness is transferred to the substrate in an etching step using the resist as a mask, the unevenness causes deterioration in electric properties thereby resulting in the yield reduction. Particularly, in an ultra fine range of 0.25 μm or less, the line edge roughness is a very important subject to be improved. A trade off relation between high sensitivity and high resolution, good pattern profile and good line edge roughness exists in the resist composition, and it is very important that these characteristics are satisfied at the same time.

Many attempts to use an acid-decomposable group-containing polysiloxane or polysilsesquioxane have been hitherto made as described, for example, in Patent Documents 1 to 8. Further, as an example of application of a silicon-containing two-layer resist to the electron beam lithography, a positive resist using a polysilphenylenesiloxane polymer described in Non-Patent Document 1.

However, in the present circumstances, any of these techniques cannot fulfill requirements for high sensitivity, high resolution and good line edge roughness at the same time in the ultra fine region.

Patent Document 1: JP-A-6-184311 (the term "JP-A" as used herein means an "unexamined published Japanese patent application")

Patent Document 2: JP-A-8-160620
Patent Document 3: JP-A-9-274319
Patent Document 4: JP-A-2001-147538
Patent Document 5: JP-A-2002-6494
Patent Document 6: JP-A-2001-330957
Patent Document 7: JP-A-2000-219743
Patent Document 8: JP-A-2001-109150
Non-Patent Document 1: *Journal of Photopolymer Science and Technology*, Vol. 9, page 697 (1996)

SUMMARY OF THE INVENTION

An object of the present invention is to solve the problems on performance improving techniques in fine fabrication of semiconductor device using a high energy beam, particularly, an electron beam, an X ray or an EUV beam.

Specifically, an object of the invention is to provide a positive resist composition that simultaneously satisfies high sensitivity, high resolution and good line edge roughness.

Other objects of the invention will become apparent from the following description.

As a result of the extensive investigations, it has been surprisingly found that the above-described objects of the invention can be achieved by a positive resist composition including an acid-decomposable group-containing polysiloxane or polysilsesquioxane and a specific amount of a compound capable of generating a sulfonic acid.

Specifically, the positive resist composition according to the invention has the following constructions.

(1) A positive resist composition comprising (A) polysiloxane or polysilsesquioxane that has a property of increasing solubility in an alkali developing solution by the action of an acid and contains a group capable of being decomposed with an acid, (B) a compound that generates a sulfonic acid upon irradiation of an actinic ray or radiation and (C) an organic basic compound, wherein an amount of the compound that generates a sulfonic acid upon irradiation of an actinic ray or radiation is from 6 to 20% by weight based on the total solid content of the positive resist composition.

(2) The positive resist composition as described in (1) above, wherein the polysiloxane or polysilsesquioxane (A) has a structure represented by formula (1) shown below in the side chain thereof:

(1)

wherein, J1 represents an alkylene group; J2 represents an arylene group or a cycloalkylene group; J3 represents a divalent connecting group; J4 represents a divalent, trivalent or tetravalent connecting group; J5 represents a group capable of being decomposed by the action of an acid; k, l, m and n each independently represent 0 or 1, provided that k, l, m and n are not 0 at the same time; and p represents an integer of from 1 to 3.

(3) The positive resist composition as described in (1) or (2) above, wherein an amount of the organic basic compound (C) is from 0.05 to 1.0% by weight based on the total solid content of the positive resist composition.

(4) The positive resist composition as described in any one of (1) to (3) above, wherein a light source for exposure is any one of an electron beam, an X ray and an EUV beam.

DETAILED DESCRIPTION OF THE INVENTION

Further, the following construction is illustrated as a preferred embodiment.

(5) The positive resist composition as described in any one of (1) to (4) above, which further comprises a fluorine-based and/or silicon-based surfactant.

The invention will be described in greater detail below.

[1] Acid-decomposable Polysiloxane or Polysilsesquioxane (Component (A))

The polysiloxane or polysilsesquioxane of Component (A) is a polysiloxane or polysilsesquioxane that has a property of increasing solubility in an alkali developing solution by the action of an acid and contains a group (an acid-decomposable group) capable of being decomposed with an acid to generate an alkali-soluble group.

The alkali-soluble group include, for example, a hydroxy group or a carboxy group.

As Component (A), a polymer having an acid-decomposable group in the side chain thereof is exemplified, and a polymer having a structure represented by formula (1) described above in the side chain thereof is preferred.

In formula (1), the alkylene group represented by J1 may have a substituent and is preferably an alkylene group having from 1 to 10 carbon atoms. Examples of the substituent include a halogen atom, for example, Cl, Br or F, a —CN group, an —OH group, an amino group, an alkyl group having from 1 to 4 carbon atoms, a cycloalkyl group having from 3 to 8 carbon atoms, an alkoxy group having from 1 to 4 carbon atoms, an aryl group having from 6 to 12 carbon atoms and an aralkyl group having from 7 to 14 carbon atoms.

J1 is more preferably an alkylene group having from 1 to 6 carbon atoms, and still more preferably an alkylene group having from 1 to 4 carbon atoms (for example, a methylene group, an ethylene group or a propylene group).

k represents 0 or 1.

The arylene group represented by J2 may have a substituent and is preferably an arylene group having from 6 to 14 carbon atoms. Examples of the substituent include those described for the alkylene group represented by J1.

The cycloalkylene group represented by J2 may have a substituent and is preferably a cycloalkylene group having from 4 to 10 carbon atoms. Examples of the substituent include those described for the alkylene group represented by J1.

J2 is more preferably an arylene group having from 6 to 10 carbon atoms (for example, a phenylene group or a naphthylene group) or a cycloalkylene group having from 5 to 8 carbon atoms (for example, a cyclohexylene group or a cyclooctylene group).

l represents 0 or 1.

J3 represents a divalent connecting group. Examples of the divalent connecting group include —O—, —N($R_1$)—, —COO—, —OC(=O)—, —O(C=O)O—, —CON($R_1$)—, —N($R_1$)CO— or —NH—CO—NH—.

$R_1$ represents a hydrogen atom or an alkyl group having from 1 to 6 carbon atoms, preferably a hydrogen atom or an alkyl group having from 1 to 3 carbon atoms.

J3 preferably represents —COO—, —OC(=O)—, —O—, —CON($R_1$)— or —N($R_1$)CO—.

m represents 0 or 1.

J4 represents a divalent, trivalent or tetravalent connecting group. Preferred examples of the connecting group include an alkylene group having from 1 to 8 carbon atoms, which may have a substituent, a cycloalkylene group having from 4 to 10 carbon atoms, which may have a substituent, a bicycloalkylene group having from 5 to 10 carbon atoms, which may have a substituent, a tricycloalkylene group having from 5 to 10 carbon atoms, which may have a substituent, an arylene group having from 6 to 12 carbon atoms, which may have a substituent, and trivalent or tetravalent groups formed by eliminating one or two hydrogen atoms from these connecting groups.

Two or more of the above connecting groups are combined with each other to form one connecting group.

The above substituent includes, for example, an alkyl group having from 1 to 4 carbon atoms and an aryl group having from 6 to 12 carbon atoms, which may have a substituent. The substituent for the aryl group includes a group capable of being decomposed by the action of an acid, that is, an acid-decomposable group as described hereinafter.

More preferred examples of the connecting group include an alkylene group having from 1 to 5 carbon atoms, which may have a substituent, a trivalent group formed by eliminating one hydrogen atom from the alkylene group, a bicycloalkylene group having from 5 to 8 carbon atoms, which may have a substituent, a tricycloalkylene group having from 5 to 8 carbon atoms, which may have a substituent, a phenylene group, which may have a substituent and a trivalent or tetravalent group formed by eliminating one or two hydrogen atoms from the phenylene group.

n represents 0 or 1.

Two or more of the above connecting groups are combined with each other to form one connecting group.

The above substituent include, for example, an alkyl group having from 1 to 4 carbon atoms and an aryl group having from 6 to 12 carbon atoms, which may have a substituent. The substituent for the aryl group includes a group capable of being decomposed by the action of an acid, that is, an acid-decomposable group as described hereinafter.

J5 represents a group (an acid-decomposable group) capable of being decomposed by the action of an acid to generate an alkali-soluble group. Preferred examples of the acid-decomposable group include —COO—$R_2$, —OCO—$R_2$, —O—CH($CH_3$)—O—$R_3$ and —COOCH($CH_3$)—O—$R_3$.

$R_2$ represents a tertiary alkyl group and preferably a tertiary alkyl group having from 4 to 8 carbon atoms (for example, a tert-butyl group or a tert-amyl group). $R_3$ represents an alkyl group having from 2 to 12 carbon atoms, which may have a substituent or an aralkyl group having from 7 to 14 carbon atoms, which may have a substituent.

Examples of the substituent include a halogen atom, for example, Cl, Br or F, a —CN group, an —OH group, an amino group, an alkyl group having from 1 to 4 carbon atoms, a cycloalkyl group having from 3 to 8 carbon atoms, an alkoxy group having from 1 to 4 carbon atoms, an aryl group having from 6 to 12 carbon atoms and an aralkyl group having from 7 to 14 carbon atoms.

Preferred examples of $R_3$ include an ethyl group, a propyl group, a butyl group, an isobutyl group, a tert-butyl group, an isoamyl group, a cyclohexylmethyl group, a cyclohexylethyl group, a benzyl group, a phenethyl group or a phenyloxyethyl group.

p represents an integer of from 1 to 3.

However, k, l, m and n are not 0 at the same time.

It is preferred that the polysiloxane or polysilsesquioxane of Component (A) also has a side chain wherein J5 in formula (1) represents a —OH group and/or a —COOH group in place of the acid-decomposable group in view of adjustment of solubility and improvements in lithographic performances. In such a case, a ratio of the side chain wherein J5 represents a —OH group and/or a —COOH group is preferably not more than 60%, more preferably from 5 to 40%, in terms of a mole fraction of the total amount of the side chain wherein J5 represents a —OH group and/or a —COOH group and the side chain wherein J5 represents the acid-decomposable group.

For the purposes of improving lithographic performances, a film forming property and heat resistance, the polysiloxane or polysilsesquioxane of Component (A) may have a side chain represented by formula (2) shown below and/or a side chain represented by formula (3) shown below.

$-(J6)q-(J7)r-A$  (2)

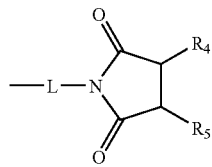

(3)

In the above formulae, J6 and J7 have the same meanings as $J_1$ and J2, respectively.

q and r each independently represents 0 or 1.

A represents an alkyl group, which may have a substituent, an aryl group, which may have a substituent or an aralkyl group, which may have a substituent.

Examples of the substituent include a halogen atom, for example, Cl, Br or F, a —CN group, an —OH group, an amino group, an alkyl group having from 1 to 4 carbon atoms, a cycloalkyl group having from 3 to 8 carbon atoms, an alkoxy group having from 1 to 4 carbon atoms, an aryl group having from 6 to 12 carbon atoms and an aralkyl group having from 7 to 14 carbon atoms.

A preferably represents an alkyl group having from 1 to 10 carbon atoms, an aryl group having from 6 to 12 carbon atoms or an aralkyl group having from 7 to 12 carbon atoms. More preferable examples for A include an alkyl group having from 1 to 8 carbon atoms (for example, a methyl group, an ethyl group, a propyl group or a cyclohexylmethyl group), an aryl group having from 6 to 9 carbon atoms (for example, a phenyl group or a p-methylphenyl methylphenyl group) and an aralkyl group having from 7 to 10 carbon atoms (for example, a benzyl group or a phenethyl group).

L has the same meaning as J1. $R_4$ and $R_5$ each independently represent a hydrogen atom or an alkyl group having from 1 to 6 carbon atoms. Alternatively, $R_4$ and $R_5$ may be connected with each other to form a ring. In such a case, a number of the rings is preferably from 1 to 3. Rings having the structure shown below are also preferred.

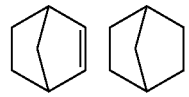

A ratio of repeating unit having the side chain represented by formula (2) and/or the side chain represented by formula (3) is preferably from 0 to 70%, more preferably from 0 to 60%, particularly preferably from 0 to 50%, in terms of a mole fraction of the total repeating units present in the polysiloxane or polysilsesquioxane of Component (A).

A weight average molecular weight of the acid-decomposable group-containing polysiloxane or polysilsesquioxane of Component (A) is not particularly restricted, but from the standpoint of compatibility with other components, solubility in an organic solvent, balance of performances or the like, it is preferably from 1,000 to 100,000, more preferably from 2,500 to 50,000.

Specific examples of the polysiloxane or polysilsesquioxane of Component (A) are set forth below, but the present invention should not be construed as being limited thereto.

In the specific examples shown below, the term "protection ratio" means a ratio of protection of an alkali-soluble group (a group exhibiting solubility in an alkali developing solution) expressed in terms of mole percent.

A numerical value put in parentheses indicates a mole fraction.

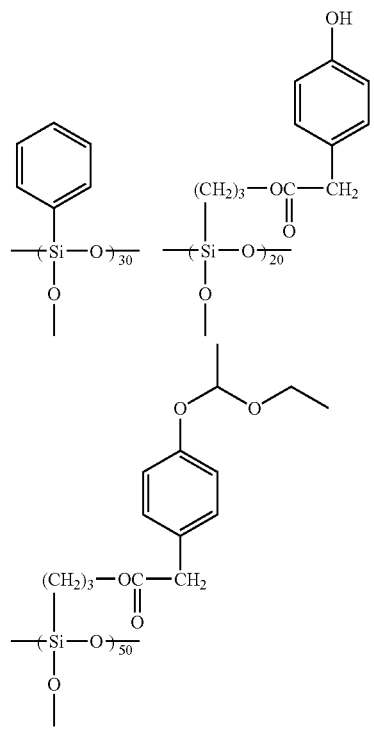

A-1

-continued
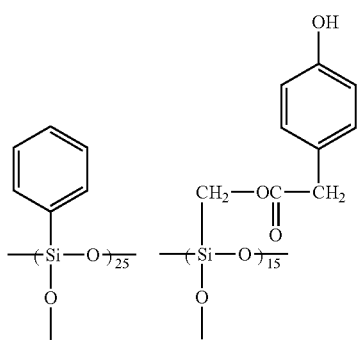
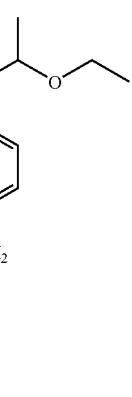
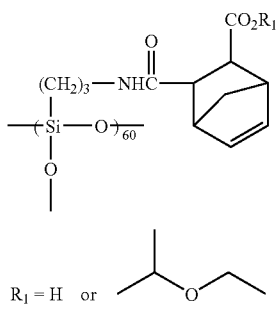
$R_1 = H$ or  
Protection Ratio of $R_1$ = 91%
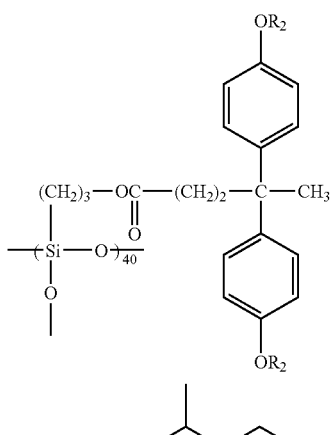
$R_2 = H$ or  
Protection Ratio of $R_2$ = 77%
A-2
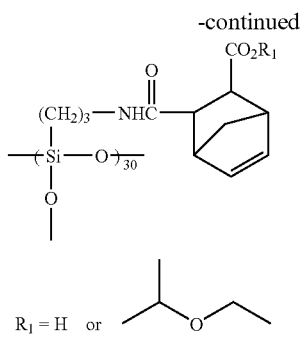
$R_1 = H$ or  
Protection Ratio of $R_1$ = 95%
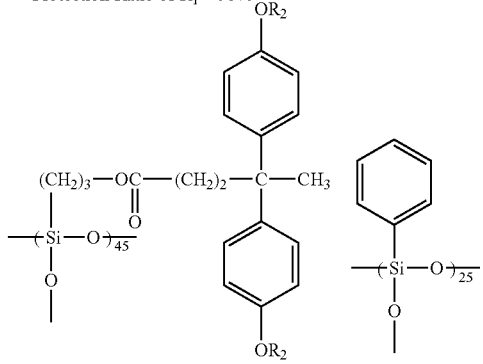
$R_2 = H$ or  
Protection Ratio of $R_2$ = 68%
A-3
A-4
A-5
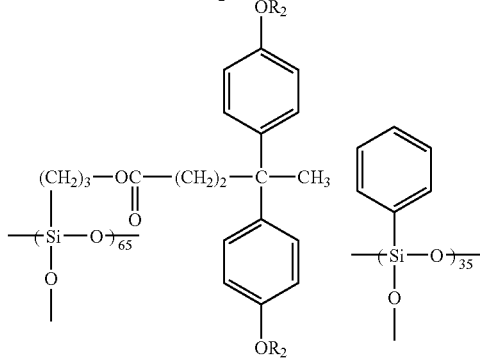
$R_2 = H$ or  
Protection Ratio of $R_2$ = 82%
A-6
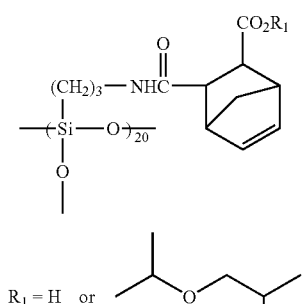
$R_1 = H$ or  
Protection Ratio of $R_1$ = 84%

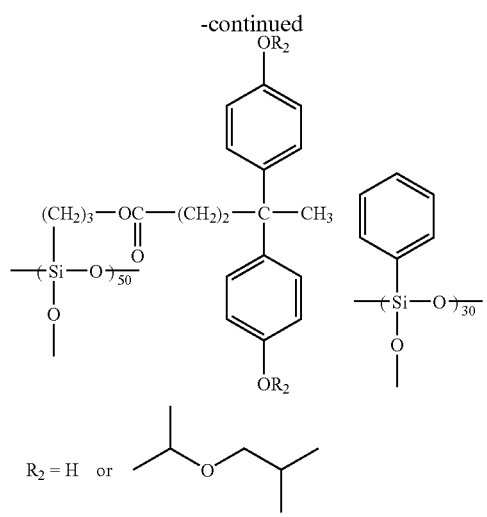

R₂ = H or (isopropyl isobutyl ether group)

Protection Ratio of R₂ = 63%

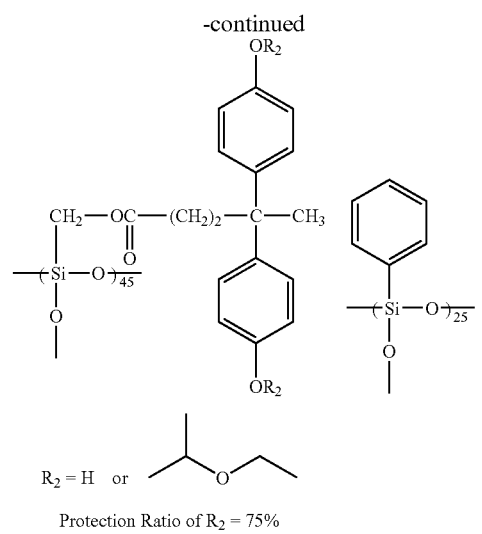

R₂ = H or (isopropyl ethyl ether group)

Protection Ratio of R₂ = 75%

A-7

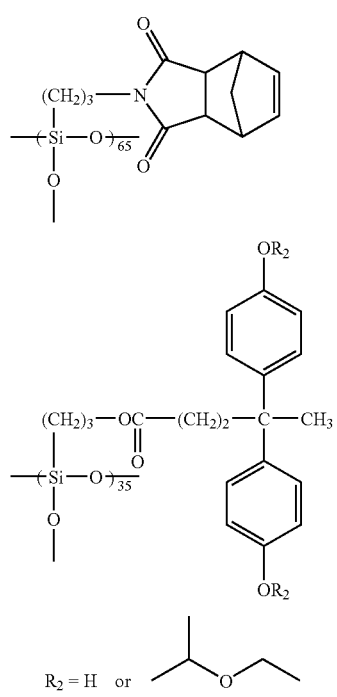

R₂ = H or (isopropyl ethyl ether group)

Protection Ratio of R₂ = 72%

A-8

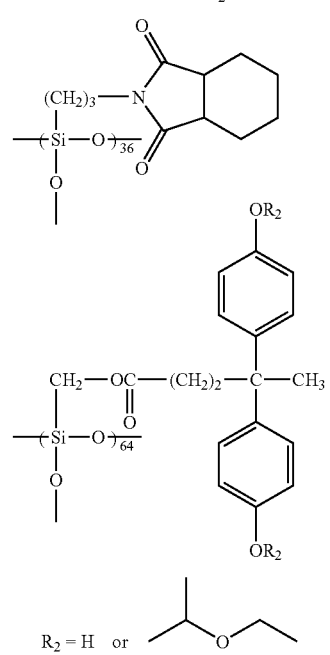

R₂ = H or (isopropyl ethyl ether group)

Protection Ratio of R₂ = 80%

A-9

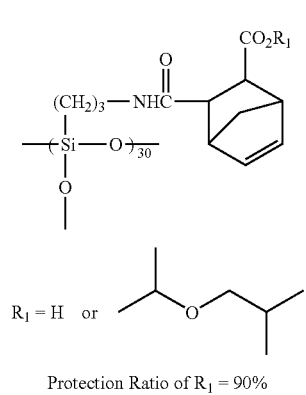

R₁ = H or (isopropyl isobutyl ether group)

Protection Ratio of R₁ = 90%

A-10

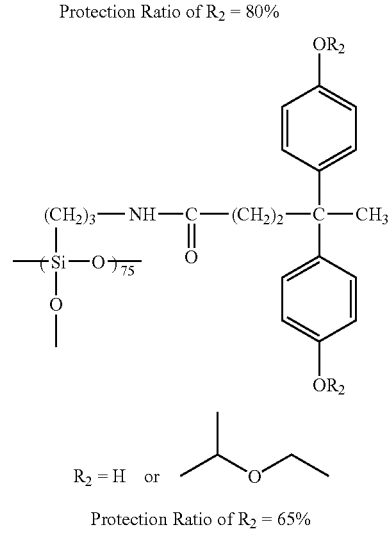

R₂ = H or (isopropyl ethyl ether group)

Protection Ratio of R₂ = 65%

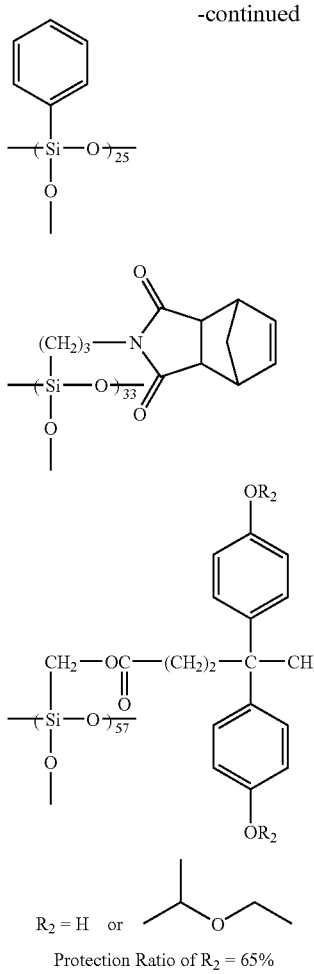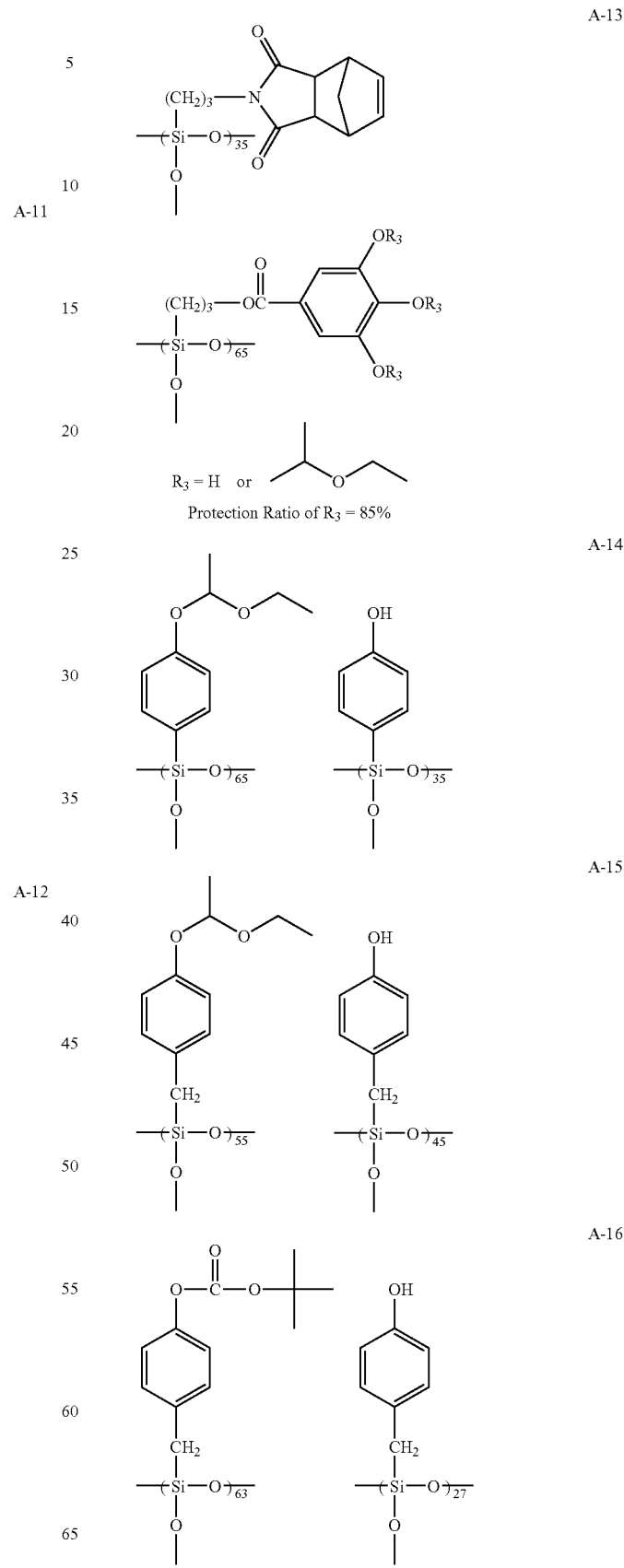

-continued

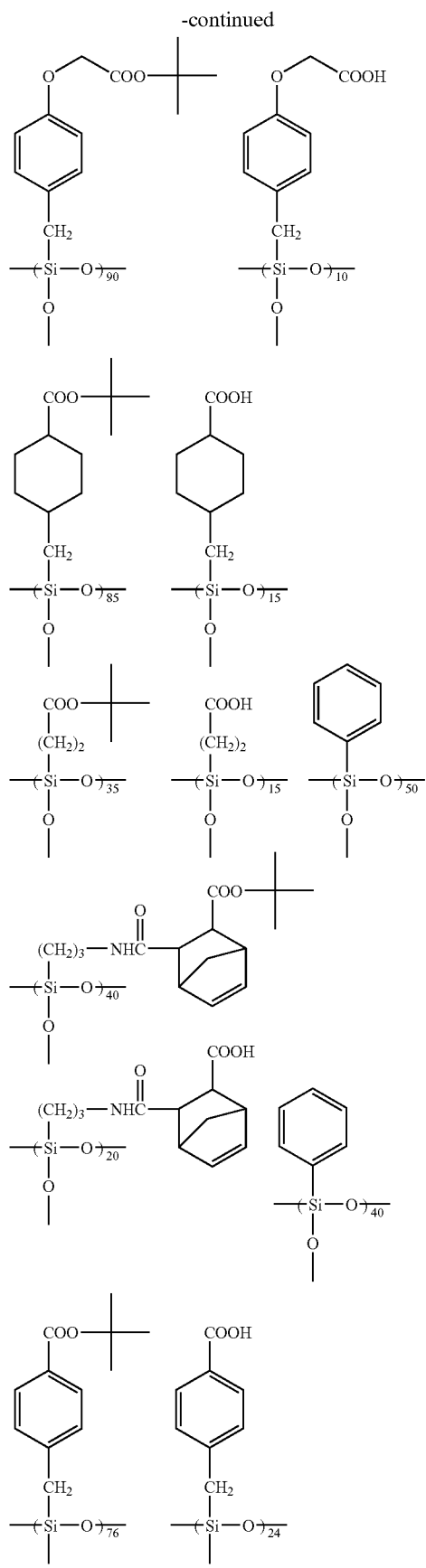

A-17
A-18
A-19
A-20
A-21

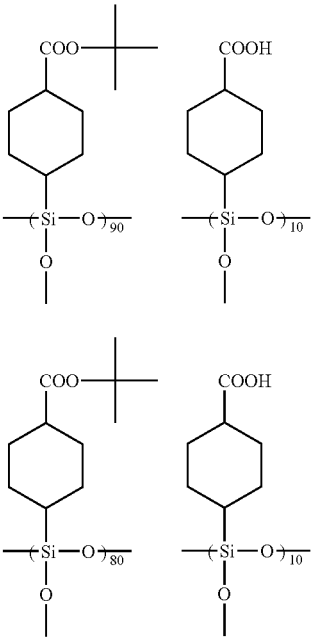

A-22
A-23

An amount of the polysiloxane or polysilsequioxane of Component (A) is preferably from 50 to 95% by weight, more preferably from 70 to 95% by weigh, based on the total solid content of the positive resist composition.

[2] Compound that Generates a Sulfonic Acid Upon Irradiation of an Actinic Ray or Radiation (Component (B))

The compound of Component (B) is a compound (sulfonic acid generator) that generates a sulfonic acid upon irradiation an actinic ray or radiation, for example, an X ray, an electron beam, an ion beams or an EUV, and known compounds can be appropriately selected and used as the compound of Component (B). Examples thereof include a diazonium salt, a phosphonium salt, a sulfonium salt, an iodonium salt, an imidosulfonate, an oximesulfonate, a diazodisulfone, a disulfone and an o-nitrobenzyl sulfonate.

Also, polymer compounds in which a group or compound that generates sulfonic acid upon irradiation with an actinic ray or radiation is introduced into the main chain or side chain thereof, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds capable of generating a sulfonic acid by light as described in U.S. Pat. No. 3,779,778 and European Patent 126,712 can be used.

In the present invention, a sulfonim salt, an iodonium salt, an imdosulfonate, an oximesulfonate, a diazodisulfone and a disulfone are preferably used as the sulfonic acid generator from the standpoint of improving image performances, for example, resolution or pattern shape.

Particularly preferred examples of the sulfonic acid generator are set forth below.

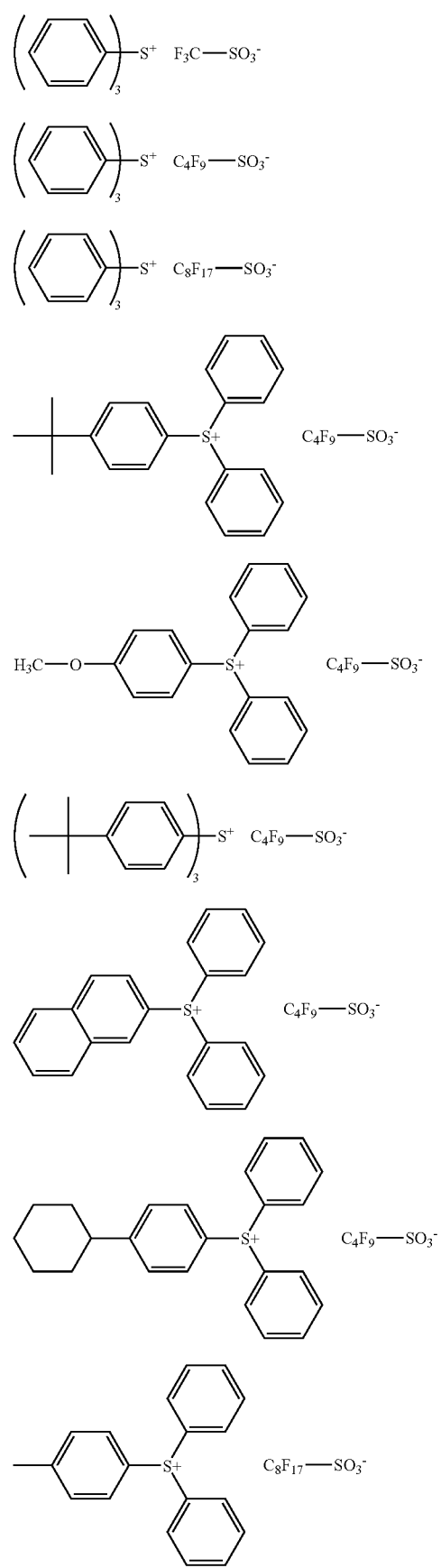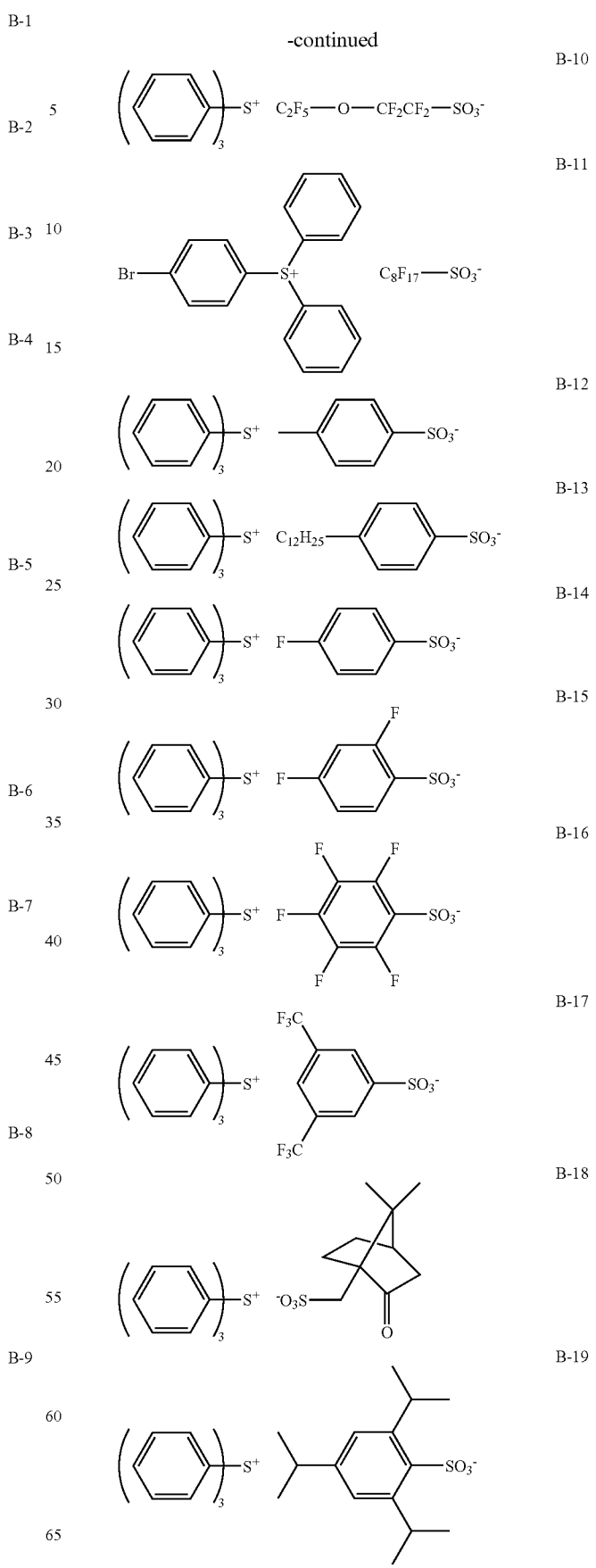

-continued
B-20
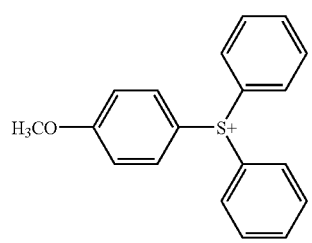
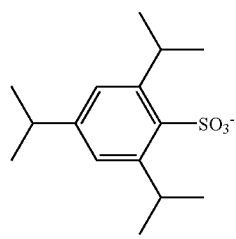
B-21
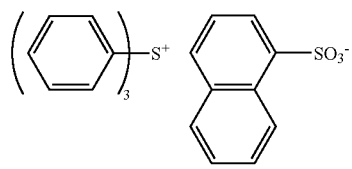
B-22
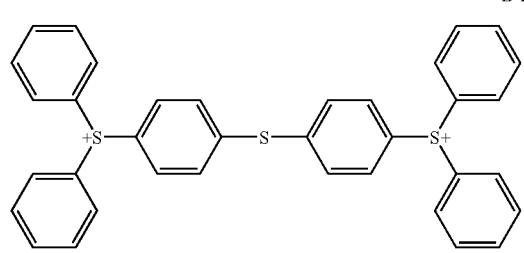
B-23
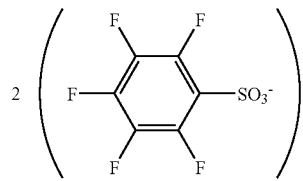
B-24
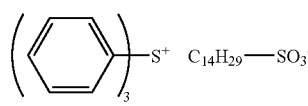
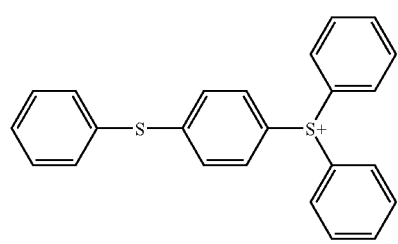
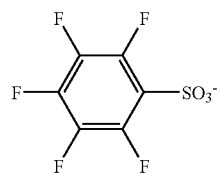
-continued
B-25
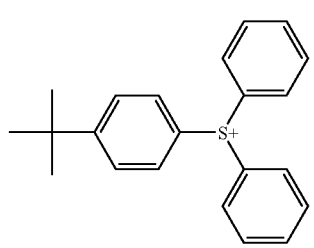
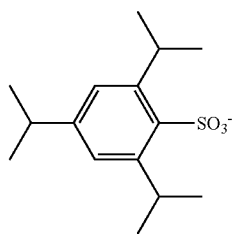
B-26
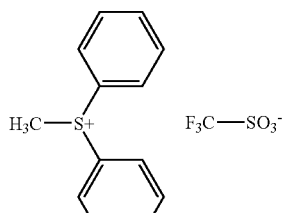
B-27
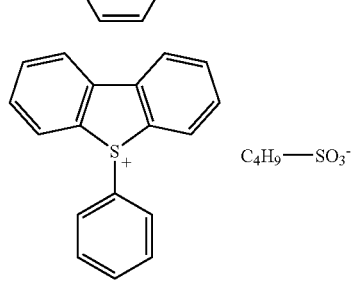
B-28
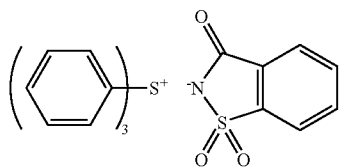
B-29
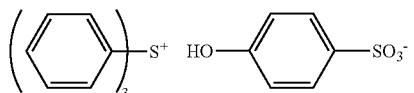
B-30
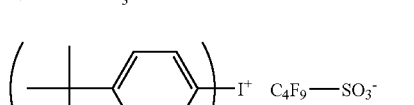
B-31
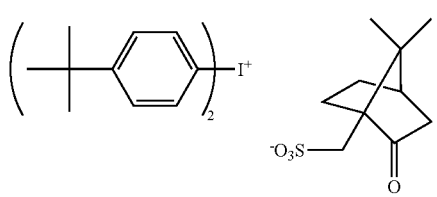

-continued

-continued

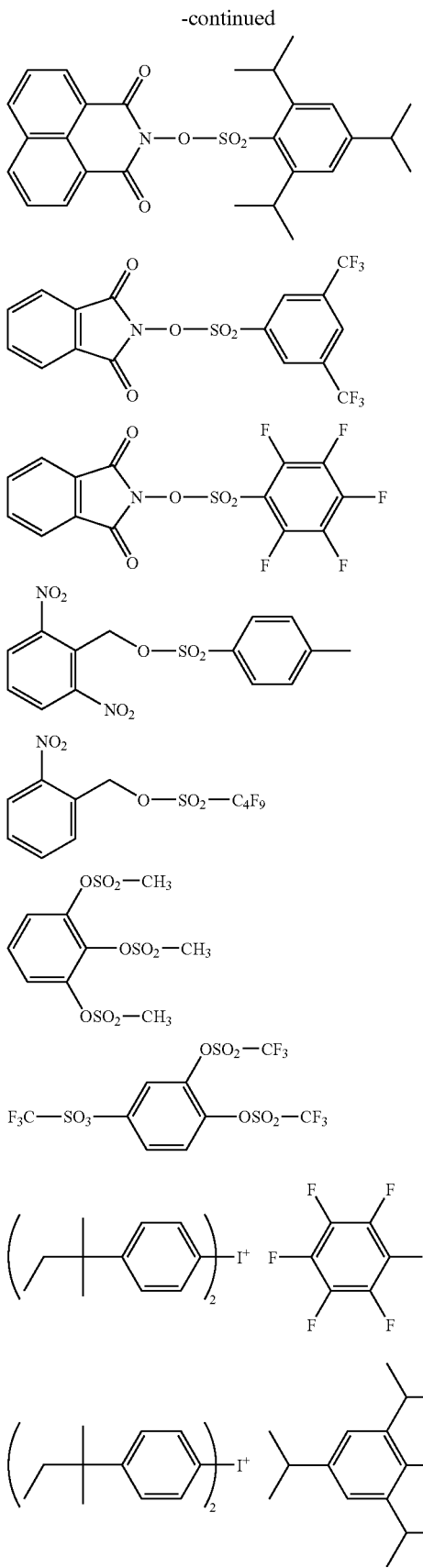

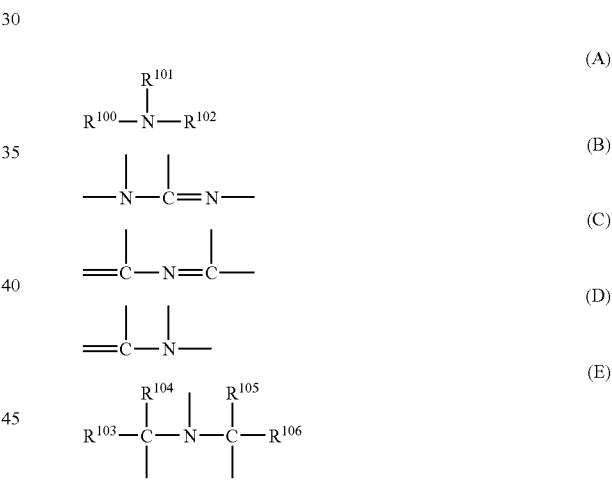

An amount of the compound of Component (B) is ordinarily from 6 to 20% by weight, preferably from 6 to 18% by weight, and particularly preferably from 7 to 16% by weight based on the solid content of the positive resist composition. The amount of the compound (B) is ordinarily not less than 6% by weight in view of sensitivity and line edge roughness, and it is ordinarily not more than 20% by weight in view of resolution. The compounds of Component (B) may be used individually or as a mixture of two or more thereof.

[3] Organic Basic Compound (Component (C))

It is preferred to use an organic basic compound in the resist composition of the present invention, from the standpoint of improving the performances, for example, resolution, and improving preservation stability.

By the addition of the organic basic compound, diffusion of a sulfonic acid generated from the sulfonic acid generator can be controlled.

A preferred organic basic compound that can be used in the invention is a compound having basicity stronger than phenol. Further, a nitrogen-containing basic compound is preferably used.

As a preferred chemical environment, which the organic basic compound has, structures of the following formulae (A) to (E) can be enumerated. Each of the structures of formulae (B) to (E) may constitute a part of the ring structure.

In the above formulae, $R^{100}$, $R^{101}$ and $R^{102}$, which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{101}$ and $R^{102}$ may be connected with each together to form a ring.

$R^{103}$, $R^{104}$, $R^{105}$ and $R^{106}$, which may be the same or different, each represent an alkyl group having from 1 to 6 carbon atoms.

The organic basic compound is more preferably a nitrogen-containing basic compound having two or more nitrogen atoms having chemical environment different from each other in one molecule, and particularly preferably a compound having both a substituted or unsubstituted amino group and a ring structure containing a nitrogen atom or a compound having an alkylamino group.

Preferred examples of the compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl) pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperdinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

Also, a nitrogen-containing basic compound of a tetraalkylammonium salt type can be used. Of the compounds, a tetraalkylammonium hydroxide having from 1 to 8 carbon atoms (for example, tetramethylammonium hydroxide, tetraethylammonium hydroxide or tetra-(n-butyl)ammonium hydroxide) is particularly preferred.

The organic basic compounds may be used individually or as a mixture of two or more thereof.

An amount of the organic basic compound (C) is ordinarily from 0.05 to 1.0% by weight based on the total solid content of the positive resist composition.

With respect to the amount of the organic basic compound added, a molar ratio of the acid generator to the organic basic compound in the resist composition (total amount of acid generator)/(organic basic compound) is from 2.5 to 300, preferably from 5.0 to 200, and more preferably from 7.0 to 150. The molar ratio of not less than 2.5 is preferred in view of sensitivity and resolution, and the molar ratio of not more than 300 is preferred in view of restraining increase in the width of resist pattern with the lapse of time after exposure until heat treatment and resolution.

[4] Compound that Generates a Carboxylic Acid Upon Irradiation of an Actinic Ray or Radiation (Component (D))

It is preferred in the present invention that a compound (carboxylic acid generator) that generates a carboxylic acid upon irradiation of an actinic ray or radiation is used together with the sulfonic acid generator from the standpoint of improving performances, for example, sensitivity or resolution.

As the carboxylic acid generator, a compound represented by the following formula (D) is preferred.

(D)

In formula (D), $R_{10}$ to $R_{12}$ each independently represent an alkyl group, an alkenyl group or an aryl group; $R_{13}$ represents a hydrogen atom, an alkyl group, an alkenyl group or an aryl group; and Z represents a sulfur atom or an iodine atom. In the case where Z represents the sulfur atom, p is 1; and in the case where Z represents the iodine atom, p is 0.

In formula (D), $R_{10}$ to $R_{12}$ each independently represent an alkyl group, an alkenyl group or an aryl group, and each of these groups may have a substituent.

The alkyl group, alkenyl group and aryl group represented by any one of $R_{10}$ to $R_{12}$ include those having a substituent.

Examples of the substituent for the alkyl group or alkenyl group include a halogen atom (for example, a chlorine atom, a bromine atom or a fluorine atom), an aryl group (for example, a phenyl group or a naphthyl group), a hydroxy group and an alkoxy group (for example, a methoxy group, an ethoxy group or a butoxy group).

Examples of the substituent for the aryl group include a halogen atom (for example, a chlorine atom, a bromine atom or a fluorine atom), a nitro group, a cyano group, an alkyl group (for example, a methyl group, an ethyl group, a tert-butyl group, a tert-amyl group or an octyl group), a hydroxy group and an alkoxy group (for example, a methoxy group, an ethoxy group or a butoxy group).

$R_{10}$ to $R_{12}$ each independently preferably represent an alkyl group having from 1 to 12 carbon atoms, an alkenyl group having from 2 to 12 carbon atoms or an aryl group having from 6 to 24 carbon atoms, more preferably an alkyl group having from 1 to 6 carbon atoms or an aryl group having from 6 to 18 carbon atoms, and particularly preferably an aryl group having from 6 to 15 carbon atoms. These groups may each have a substituent.

$R_{13}$ represents a hydrogen atom, an alkyl group, an alkenyl group or an aryl group.

The alkyl group, alkenyl group and aryl group represented by $R_{13}$ include those having a substituent.

Examples of the substituent for the alkyl group or alkenyl group include those described for the examples of the substituent in the case where $R_{10}$ represents an alkyl group or alkenyl group. Examples of the substituent for the aryl group include those described for the examples of the substituent in the case where $R_{10}$ represents an aryl group.

$R_{13}$ preferably represents a hydrogen atom, an alkyl group having from 1 to 30 carbon atoms, an alkenyl group having from 2 to 30 carbon atoms or an aryl group having from 6 to 24 carbon atoms, more preferably an alkyl group having from 1 to 18 carbon atoms or an aryl group having from 6 to 18 carbon atoms, and particularly preferably an alkyl group having from 1 to 12 carbon atoms or an aryl group having from 6 to 15 carbon atoms. These groups may each have a substituent.

Z represents a sulfur atom or an iodine atom. In the case where Z represents the sulfur atom, p is 1, and in the case where Z represents the iodine atom, p is 0.

Two or more cation moieties in formula (D) may be connected with each other through a single bond or a connecting group (for example, —S— or —O—) to form a cation structure having a plurality of the cation moieties in formula (D).

Preferred examples of the compound represented by formula (D) are set forth below, but the invention should not be construed as being limited thereto.

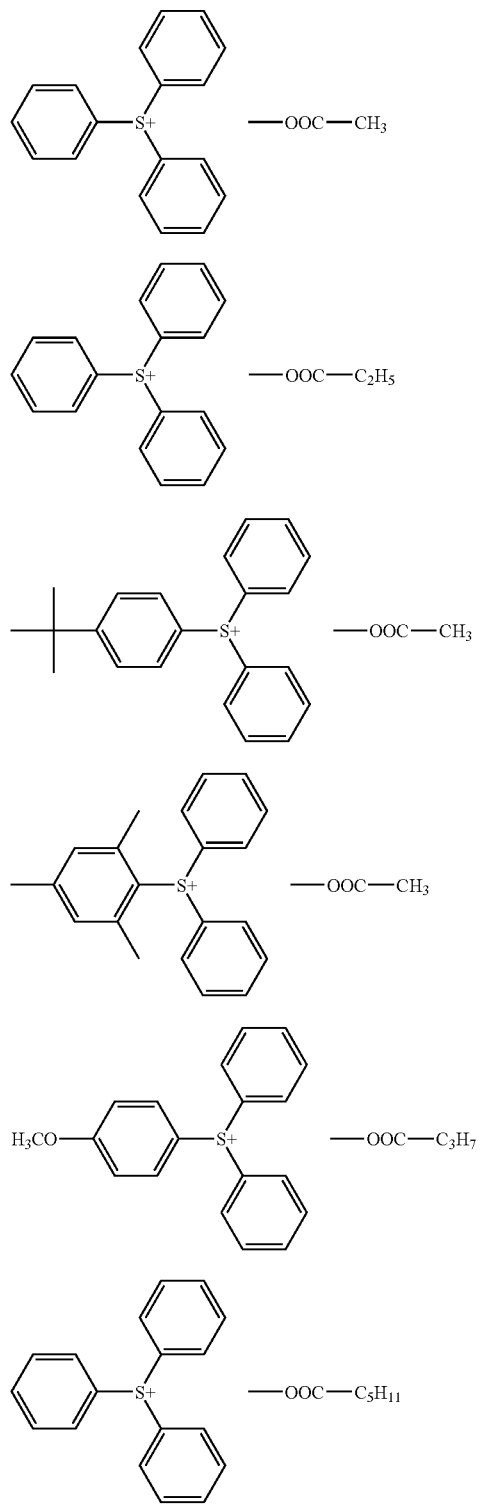

-continued

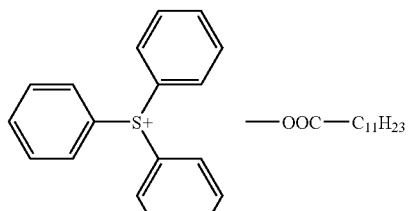

D-7

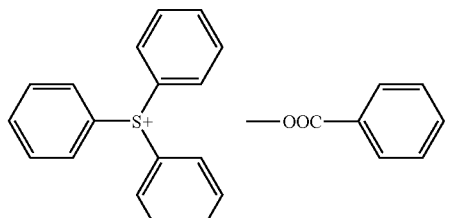

D-8

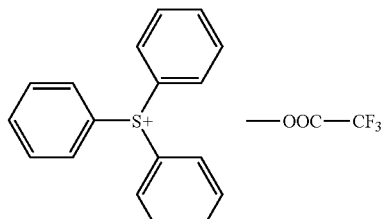

D-9

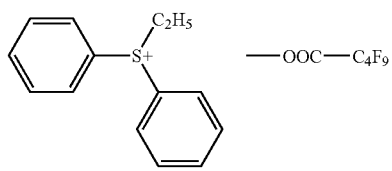

D-10

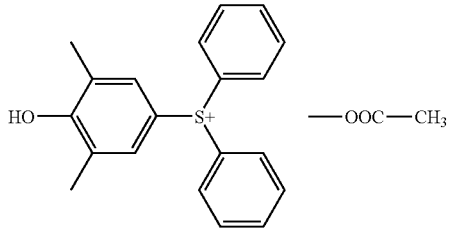

D-11

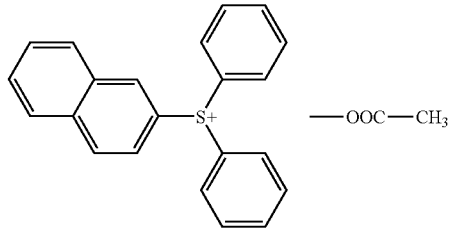

D-12

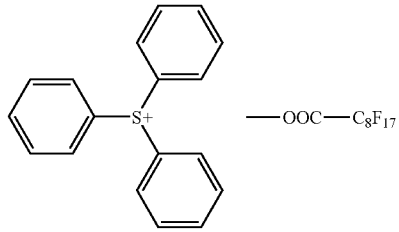

D-13

D-14
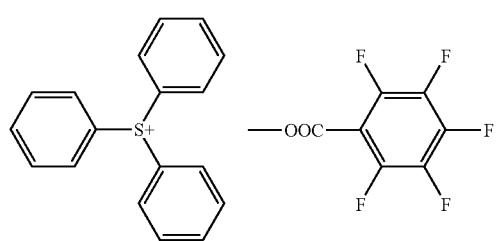
D-15
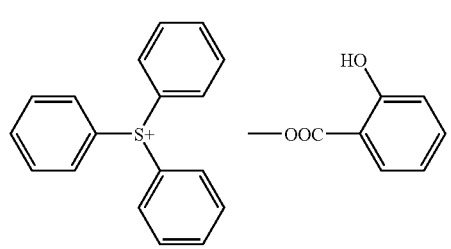
D-16
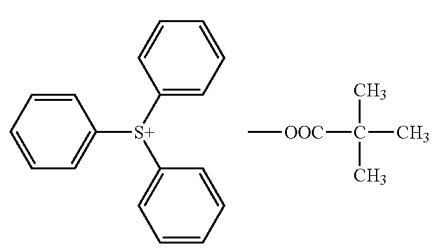
D-17
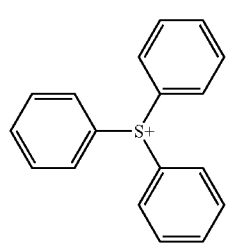
D-18
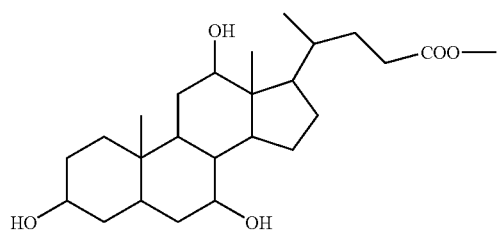
D-19
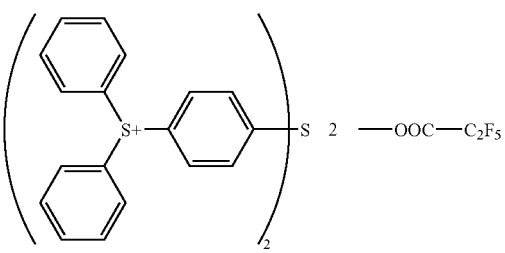
D-20
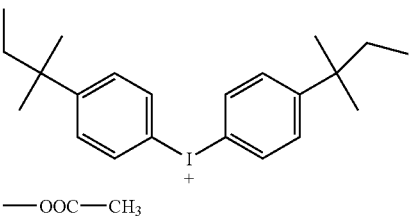
D-21
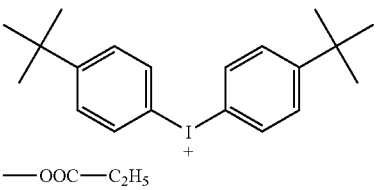
D-22
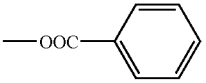
D-23
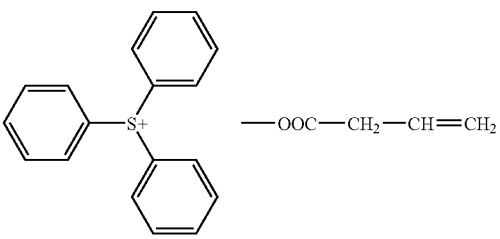
D-24
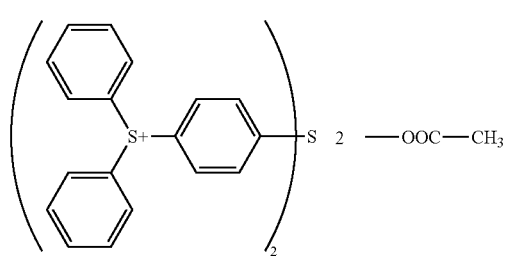
D-25
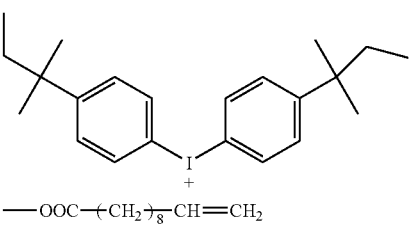

An amount of the compound of Component (D) in the positive resist composition of the present invention is preferably from 0.01 to 10% by weight, more preferably from 0.03 to 5% by weight, and particularly preferably from 0.05 to 3% by weight based on the solid content of the resist composition. The compounds that generate a carboxylic acid upon irradiation of an actinic ray or radiation may be used individually or as a mixture of two or more thereof.

A ratio of the compound of Component (B)/the compound of Component (D) by weight is ordinarily from 99.9/0.1 to 50/50, preferably 99/1 to 60/40, and particularly preferably from 98/2 to 70/30.

[5] Surfactant

In the present invention, a surfactant can be used, and the use of surfactant is preferred from the viewpoint of film forming property, adhesion of pattern, reduction of development defect or the like.

Specific examples of the surfactant include nonionic surfactants, for example, polyoxyethylene alkyl ethers (for example, polyoxyethylene lauryl ether, polyoxyethylene stearyl ether, polyoxyethylene cetyl ether or polyoxyethylene oleyl ether), polyoxyethylene alkylaryl ethers (for example, polyoxyethylene octylphenyl ether or polyoxyethylene nonylphenyl ether), polyoxyethylene-polyoxypropylene block copolymers, sorbitan fatty acid esters (for example, sorbitan monolaurate, sorbitan monopalmitate, sorbitan monostearate, sorbitan monooleate, sorbitan trioleate or sorbitan tristearate) and polyoxyethylene sorbitan fatty acid esters (for example, polyoxyethylene sorbitan monolaurate, polyoxyethylene sorbitan monopalmitate, polyoxyethylene sorbitan mono-stearate, polyoxyethylene sorbitan trioleate or poly-oxyethylene sorbitan tristearate); fluorine based surfactants or silicon based surfactants, for example, Eftop EF301, Eftop EF303 or Eftop EF352 (manufactured by Jemco Inc.), Megafac F171 or Megafac F173 (manufactured by Dainippon Ink and Chemicals, Inc.), Fluorad FC430 or Fluorad FC431 (manufactured by Sumitomo 3M Limited), Asahi Guard AG710, Surflon S-382, Surflon SC101, Surflon SC102, Surflon SC103, Surflon SC104, Surflon SC105 or Surflon SC106 (manufactured by Asahi Glass Co., Ltd.) and Troysol S-366 (manufactured by Troy Chemical Industries, Inc.); organosiloxane polymers (for example, KP341 manufactured by Shin-Etsu Chemical Co., Ltd.) and acrylic acid based or methacrylic acid based (co)polymers (for example, Polyflow No. 75 or Polyflow No. 95 manufactured by Kyoeisha Chemical Co., Ltd.).

An amount of the surfactant is ordinarily not more than 2 parts by weight, and preferably not more than 1 part by weight based on 100 parts by weight of the solid content of the resist composition of the present invention.

The surfactants may be used individually or in combination of two or more thereof.

It is preferred to contain either one or two or more kinds of fluorine based and/or silicon based surfactants (including a fluorine based surfactant, a silicon based surfactant and a surfactant containing both a fluorine atom and a silicon atom) as the surfactant in view of improving film forming property, reducing development defect and increasing wettability of a developing solution on the resist film.

Examples of such surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451.

Further, commercially available surfactants as described below can also be used as they are.

Examples of the commercially available surfactant that can be used include fluorine based surfactants or silicon based surfactants, for example, Eftop EF301 or Eftop EF303 (manufactured by Jemco Inc.), Fluorad FC430 or Fluorad FC431 (manufactured by Sumitomo 3M Limited), Megafac F171, Megafac F173, Megafac F176, Megafac F189 or Megafac R08 (manufactured by Dainippon Ink and Chemicals, Inc.), Surflon S-382, Surflon SC101, Surflon SC102, Surflon SC103, Surflon SC104, Surflon SC105 or Surflon SC106 (manufactured by Asahi Glass Co., Ltd.) and Troysol S-366 (manudactured by Troy Chemical Industries, Inc.). Also, Polysiloxane Polymer KP-341 (manufactured by Shin-Etsu Chemical Co., Ltd.) can be used as the silicon based surfactant.

Besides the above-described known surfactants, surfactants using a polymer containing a fluoro aliphatic group derived from a fluoro aliphatic compound produced by a telomerization process (also called a telomer process) or an oligomerization process (also called an oligomer process) can also be used as the surfactant. The fluoro aliphatic compound can be synthesized according to the method described in JP-A-2002-90991.

As the polymer containing a fluoro aliphatic group, copolymers of a fluoro aliphatic group-containing monomer and a (poly(oxyalkylene)) acrylate and/or a (poly(oxyalkylene)) methacrylate are preferred. The copolymer may be in the form of a random copolymer or a block copolymer. Examples of the poly(oxyalkylene) group include a poly (oxyethylene) group, a poly(oxypropylene) group and a poly(oxybutylene) group. Also, units containing alkylenes having a different chain length in the same chain, for example, a poly(block connecting body of oxyethylene, oxypropylene and oxyethylene) group and a poly(block connecting body of oxyethylene and oxypropylene) group may be used. Further, the copolymer of a fluoro aliphatic group-containing monomer and a (poly(oxyalkylene)) acrylate (or methacrylate) includes not only binary copolymers but also ternary or multi-component copolymers prepared by copolymerization of two or more different fluoro aliphatic group-containing monomers or two and more different (poly (oxyalkylene)) acrylates (or methacrylates).

Examples of commercially available surfactants include Megafac F178, Megafac F-470, Megafac F-473, Megafac F-475, Megafac F-476 or Megafac F-472 (manufactured by Dainippon Ink and Chemicals, Inc.). Also, copolymers of a $C_6F_{13}$ group-containing acrylate (or methacrylate) and a (poly(oxyalkylene)) acrylate (or methacrylate), copolymers of a $C_6F_{13}$ group-containing acrylate (or methacrylate), (poly(oxyethylene)) acrylate (or methacrylate) and (poly (oxypropylene)) acrylate (or methacrylate), copolymers of a $C_8F_{17}$ group-containing acrylate (or methacrylate) and a (poly(oxyalkylene)) acrylate (or methacrylate), and copolymers of a $C_8F_{17}$ group-containing acrylate (or methacrylate), (poly(oxyethylene)) acrylate (or methacrylate) and (poly (oxypropylene)) acrylate (or methacrylate) can be exemplified.

An amount of the surfactant used is preferably from 0.0001 to 2% by weight, and more preferably from 0.001 to 1% by weight based on the total amount of the positive resist composition (excluding a solvent).

[6] Other Components

The positive resist composition of the present invention may further contain other components, for example, a dye, a photo-base generator or the like, if desired.

1. Dye

In the resist composition of the present invention, a dye can be used.

The dye suitably used includes an oil dye and a basic dye. Specific examples of the dye include Oil Yellow #101, Oil Yellow #103, Oil Pink #312, Oil Green BG, Oil Blue BOS, Oil Blue #603, Oil Black BY, Oil Black BS and Oil Black T-505 (manufactured by Orient Chemical Industries, Ltd.), Crystal Violet (CI 42555), Methyl Violet (CI 42535), Rhodamine B (CI 45170B), Malachite Green (CI 42000) and Methylene Blue (CI 52015).

2. Photo-base Generator

Examples of the photo-base generator that can be added to the resist composition of the invention include compounds described in JP-A-4-151156, JP-A-4-162040, JP-A-5-197148, JP-A-5-5995, JP-A-6-194834, JP-A-8-146608, JP-A-10-83079 and European Patent 622,682. More specifically, 2-nitrobenzyl carbamate, 2,5-dinitrobenzylcyclohexyl carbamate, N-cyclohexyl-4-methylphenyl sulfonamide and 1,1-dimethyl-2-phenylethyl-N-isopropyl carbamate can be preferably used. The photo-base generator is added for the purpose of improving, for example, resist shape.

[7] Solvent

The resist composition of the present invention is dissolved in a solvent capable of dissolving the above-described respective components and coated on a substrate. Concentration of the solid content of the resist composition is ordinarily from 2 to 30% by weight, and preferably from 3 to 25% by weight.

Examples of the solvent preferably used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. The solvents may be used individually or as a mixture of two or more thereof.

The resist composition of the present invention is coated on a substrate to form a thin film. The coated film preferably has a film thickness of from 0.05 to 4.0 μm.

In the present invention, a known inorganic or organic anti-reflective coating can be used, if desired. Further, an anti-reflective coating can also be coated on the resist layer.

As the anti-reflective coating used as an under layer of the resist, any of an inorganic film type comprising, for example, titanium, titanium dioxide, titanium nitride, chromium oxide, carbon or amorphous silicon and an organic film type comprising a light absorber and a polymer material can be used. The former requires equipment, for example, a vacuum vapor deposition apparatus, a CVD apparatus or a sputtering apparatus in the film formation. Examples of the organic anti-reflective coating include anti-reflective coating comprising a condensate of a diphenylamine derivative and a formaldehyde-modified melamine resin, an alkali-soluble resin and a light absorber as described in JP-B-7-69611; anti-reflective coating comprising a reaction product of a maleic anhydride copolymer and a diamine type light absorber as described in U.S. Pat. No. 5,294,680; anti-reflective coating comprising a resin binder and a methylolmelamine based thermal crosslinking agent as described in JP-A-6-118631; acrylic resin type anti-reflective coating containing a carboxylic acid group, an epoxy group and a light absorbing group in the same molecule as described in JP-A-6-118656; anti-reflective coating comprising methylolmelamine and a benzophenone based light absorber as described in JP-A-8-87115; and anti-reflective coating comprising a polyvinyl alcohol resin having a low-molecular light absorber added thereto as described in JP-A-8-179509.

Also, commercially available anti-reflective coating, for example, DUV30 Series or DUV40 Series manufactured by Brewer Science, Inc. and AR-2, AR-3 or AR-5 manufactured by Shipley Company, LLC can be used as the organic anti-reflective coating.

In the production of precision integrated circuit devices, the pattern formation step on the resist film is carried out by coating the positive resist composition of the present invention on a substrate (for example, silicon/silicon dioxide-coated substrate, glass substrate, ITO substrate or quartz/chromium oxide-coated substrate), irradiating the coated resist composition with an X ray, an electron beam, an ion beam or an EUV beam, heating, developing, rinsing and drying, whereby a good resist pattern can be formed.

As an alkali developing solution for the resist composition of the invention, an aqueous solution of alkali (ordinarily in an amount of from 0.1 to 20% by weight), for example, an inorganic alkali (for example, sodium hydroxide, potassium hydroxide, sodium carbonate, sodium silicate, sodium metasilicate or aqueous ammonia), a primary amine (for example, ethylamine or n-propylamine), a secondary amine (for example, diethylamine or di-n-butylamine), a tertiary amine (for example, triethylamine or methyldiethylamine), an alcoholamine (for example, diethanolamine or triethanolamine), a quaternary ammonium salt (for example, tetramethylammonium hydroxide, tetraethylammonium hydroxide or choline) and a cyclic amine (for example, pyrrole or piperidine) can be used. Further, a developing solution prepared by adding an appropriate amount of an alcohol, for example, isopropyl alcohol or a surfactant, for example, a nonionic surfactant to the above-described aqueous solution of alkali can be used.

Of the developing solutions, those containing a quaternary ammonium salt are preferred and those containing tetramethylammonium hydroxide or choline are more preferred.

The positive resist composition of the present invention is preferably used as a two-layer resist that is coated on a lower layer resist previously provided on a substrate (for example, silicon/silicon dioxide-coated substrate, glass substrate, ITO substrate or quartz/chromium oxide-coated substrate) as used in the production of precision integrated circuit devices. The formation of layer of the positive resist composition of the invention is carried out by dissolving the compounds of Components (A) to (C) in a solvent and coating the resulting solution according to a method, for example, a spin coat method or a spray method.

Although an appropriate organic polymer film is used as the lower layer resist, various known resist compositions may be used. For example, FH Series or FHi Series manufactured by Fuji Film Arch Co., Ltd. or PFI Series manufactured by Sumitomo Chemical Co., Ltd. can be illustrated. Lower layer resists of short time curing type as described in JP-A-2001-147538, JP-A-2001-6494 and JP-A-2002-311594 can also be preferably used in view of reduction of processing time of wafer.

The thickness of the lower layer resist is preferably from 0.1 to 4.0 μm, and more preferably from 0.2 to 2.0 μm. The lower layer resist having the thickness of less than 0.1 μm is unfavorable from the viewpoint of dry etching resistance and antireflection property. On the other hand, the lower layer resist having the thickness of more than 4.0 μm is also unfavorable since a problem arises in that the aspect ratio becomes too high, so that collapse of fine pattern formed tends to occur.

It is preferred that the lower layer resist is subjected to heat treatment to cure it before coating of the upper layer resist. The temperature of the heat treatment may be varied depending on the kind of the lower layer resist, but is preferably from 150 to 280° C., more preferably from 170 to 250° C., and particularly preferably 180 to 230° C. When the temperature is lower than 150° C., intermixing of the upper layer resist with the lower layer resist is liable to occur at the coating of the upper layer resist. On the other hand, the temperature higher than 280° C. results in easy decomposition of the component, for example, polymer contained in the lower layer resist. Both are therefore unfavorable. The heat treatment can be conducted using a device, for example, a hot plate or a heat oven.

Then, the upper layer resist is formed on the lower layer resist. The thickness of the upper layer resist is preferably from 0.03 to 0.6 μm, more preferably from 0.04 to 0.5 μm, and particularly preferably from 0.05 to 0.4 μm. The thickness less than 0.03 μm results in poor pattern transferring property to the lower layer resist or occurrence of pinholes in the coating film, whereas the thickness larger than 0.6 μm results in degradation of lithographic performances. Both are therefore unfavorable.

The resulting two-layer resist is then subjected to a pattern formation process. As the first step thereof, the pattern formation treatment is carried out to the film of resist composition of the second layer. In such a case, the resist composition of the second layer is irradiated with a high-energy beam directly or through a mask, thereby making the irradiated portion of the resist composition soluble in an aqueous alkali solution, followed by development with the aqueous alkali solution to form a pattern. Preferred examples of light source for the irradiation include an excimer laser beam having a wavelength not longer than 250 nm (for example, KrF, ArF or $F_2$ excimer laser beam), an electron beam, an X ray and an EUV beam.

Then, dry etching of the lower layer is performed as the second step. The operation is carried out by oxygen plasma etching using the pattern of the above-described film of resist composition of the upper layer as a mask, thereby forming a fine pattern having a high aspect ratio. In such a case, the oxygen gas may be used together with other gas, for example, nitrogen gas, argon gas, sulfurous acid gas, chlorine gas or fluorine gas.

The present invention will be described in more detail with reference to the following examples, but the invention should not be construed as being limited thereto.

SYNTHESIS EXAMPLE 1

Synthesis of Polymer A-5

To 200 ml of dried N,N-dimethylacetamide was added 20 g of 3-chloropropyltrimethoxysilane and then, 28.7 g of diphenolic acid, 3.0 g of potassium iodide and 16.0 g of 1,8-diazabicyclo-[5.4.0]-7-undecene (DBU) were added thereto. The mixture was reacted at 70 to 90° C. under dried nitrogen atmosphere for 5 hours. The reaction solution was allowed to cool to room temperature and used as it was in the next step.

(Synthesis of Unprotected Polymer)

To the reaction solution were added 20 g of phenyltrimethoxysilane and 14.5 g of distilled water, and the mixture was reacted at 50° C. for 3 hours and then at 120° C. for 12 hours. The reaction solution was neutralized with diluted hydrochloric acid and poured into 3 liters of distilled water with stirring to obtain 51 g of white solid powder.

The white powder was dried in vacuo and then 20 g thereof was dissolved in 100 ml of tetrahydrofuran. To the solution were added 2.0 g of ethyl vinyl ether and 20 mg of p-toluenesulfonic acid hydride and the mixture was reacted at room temperature for 10 hours.

The reaction was quenched by adding triethylamine, the reaction mixture was poured into 2 liters of distilled water with stirring to deposit a polymer, followed by drying at room temperature under a reduced pressure, whereby 16.2 g of the desired polymer A-5 was obtained.

Example 1

(1) Formation of Lower Resist Layer

FHi-028D Resist (manufactured by Fuji Film Arch Co., Ltd.) was coated on a silicon wafer using a spin coater (Mark 8 manufactured by Tokyo Electron Ltd.), and heated at 210° C. for 180 seconds to form a lower resist layer having a thickness of 0.50 μm.

(2) Formation of Upper Resist Layer

Component (A): A-5 0.95 g (90.1 parts by weight)
Component (B): B-2 0.10 g (9.5 parts by weight)
Component (C): C-1 (shown below) 0.003 g (0.3 parts by weight)
Other Component: W-1 (shown below) 0.001 g (0.1 parts by weight)

The above components were dissolved in 12 g of propylene glycol monomethyl ether acetate and 2 g of propylene glycol monomethyl ether. The resulting solution was subjected to microfiltration using a membrane filter having a pore size of 0.1 μm to prepare a resist solution. The amount of the compound of Component (B) is 9.5% by weight based on the total solid content of the resist composition.

The resist solution was coated on the above-described lower resist layer using a spin coater (Mark 8 manufactured by Tokyo Electron Ltd.) and heated at 120° C. for 90 seconds to form an upper resist layer having a thickness of 0.20 μm.

(3) Formation of Positive Resist Pattern

The two-layer resist film obtained was subjected to electron beam irradiation using an electron beam drawing apparatus (HL 750 manufactured by Hitachi, Ltd.; acceleration voltage: 50 KeV). After the irradiation, the resist film was heated at 115° C. for 90 seconds, developed with a developing solution of tetramethylammonium hydroxide (2.38% by weight) for 60 seconds, rinsed with pure water and dried to form an upper layer pattern. The wafer having the upper layer pattern was etched using a parallel plate type reactive ion etching apparatus (manufactured by Ulvac, Inc.) to form a lower layer pattern. The etching gas used was oxygen, the pressure was 20 mTorr, the application power was 100 mW/cm$^2$, and the etching time was 10 minutes.

With the pattern thus obtained, sensitivity, resolution and line edge roughness were evaluated in the following manner.

<Sensitivity>

A cross-sectional shape of the pattern was observed using a scanning electron microscope (S-4300 manufactured by Hitachi, Ltd.). The minimum irradiation energy necessary for resolving a line pattern of 0.15 μm (line:space=1:1) was designated as the sensitivity.

<Resolution>

The resolution was expressed using a limiting resolution (line and space being separately resolved) in the irradiation amount sufficient for obtaining the above sensitivity.

<Line Edge Roughness>

Line width was measured at random 30 points in the area having length of 50 μm in the longitudinal direction of the line pattern of 0.15 μm formed in the irradiation amount sufficient for obtaining the above sensitivity, and the variation thereof was evaluated with 3 σ.

As a result, it was found that the sensitivity, resolution and line edge roughness were 7.5 μC/cm$^2$, 0.11 μm and 5.0 nm, respectively, and they were excellent.

Examples 2 to 10

The preparation, coating and evaluation on irradiation with electron beam of resist was performed in the same manner as in Example 1 except for using each compound as shown in Table 1 below.

Comparative Example 1

The preparation, coating and evaluation on irradiation with electron beam of resist was performed in the same manner as in Example 1 except for changing the amount of sulfonic acid generator of Component (B) used in the composition of Example 1 to 4% by weight as shown in Table 1.

Comparative Example 2

The preparation, coating and evaluation on irradiation with electron beam of resist was performed in the same manner as in Example 1 except for changing the amount of sulfonic acid generator of Component (B) and the amount of organic basic compound of Component (C) used in the composition of Example 1 to 4% by weight and 0.15% by weight, respectively, as shown in Table 1.

Comparative Example 3

The preparation, coating and -evaluation on irradiation with electron beam of resist was performed in the same manner as in Example 1 except for changing the amount of sulfonic acid generator of Component (B) used in the composition of Example 1 to 5% by weight as shown in Table 1.

Comparative Example 4

The preparation, coating and evaluation on irradiation with electron beam of resist was performed in the same manner as in Example 1 except for changing the amount of sulfonic acid generator of Component (B) used in the composition of Example 1 to 21% by weight as shown in Table 1.

The components and evaluation results of each of the resist compositions are shown in Tale 1.

The compounds used in the examples and comparative examples shown in Table 1 are set forth below.

<Organic Basic Compound>
C-1: Tri-n-hexylamine
C-2: N,N-Dimethylamine
C-3: Tetra-(n-butyl)ammonium hydroxide <Surfactant>
W-1: Fluorine based surfactant (Megafac F-176 manufactured by Dainippon Ink & Chemicals Inc.)
W-2: Fluorine/silicon based surfactant (Megafac R08 manufactured by Dainippon Ink & Chemicals Inc.)
W-3: Silicon based surfactant (Polysiloxane Polymer KP 341 (manufactured by Shin-Etsu Chemical Industry Co., Ltd.)

TABLE 1

| | Composition | | | | Evaluation Result | | |
|---|---|---|---|---|---|---|---|
| | Component (A) Polymer | Component (B) Sulfonic Acid Generator | Component (C) Organic Basic Compound | Other Component | Sensitivity (μC/cm$^2$) | Resolution (μm) | Line Edge Roughness (nm) |
| Example 1 | A-5 (90.1) | B-2 (9.5) | C-1 (0.3) | W-1 (0.1) | 7.5 | 0.11 | 5.0 |
| Example 2 | A-1 (91.6) | B-19 (8.0) | C-2 (0.3) | W-1 (0.1) | 7.0 | 0.11 | 6.4 |
| Example 3 | A-3 (93.6) | B-15 (6.0) | C-1 (0.3) | W-1 (0.1) | 9.0 | 0.10 | 5.2 |
| Example 4 | A-7 (92.6) | B-2 (2.5) B-33 (4.5) | C-2 (0.3) | W-1 (0.1) | 6.5 | 0.11 | 4.5 |
| Example 5 | A-8 (91.6) | B-30 (8.0) | C-1 (0.3) | W-1 (0.1) | 6.5 | 0.11 | 5.2 |
| Example 6 | A-10 (91.6) | B-16 (8.0) | C-2 (0.3) | W-3 (0.1) | 6.5 | 0.10 | 5.5 |
| Example 7 | A-14 (88.6) | B-3 (11.0) | C-1 (0.4) | W-2 (0.1) | 5.5 | 0.11 | 6.0 |
| Example 8 | A-15 (90.5) | B-1 (5.0) B-12 (4.0) | C-2 (0.3) | W-2 (0.1) D-1 (0.1) | 7.0 | 0.09 | 6.5 |
| Example 9 | A-21 (91.4) | B-2 (6.5) B-58 (1.5) | C-3 (0.3) | W-2 (0.1) D-13 (0.2) | 7.5 | 0.10 | 5.4 |
| Example 10 | A-18 (91.9) | B-2 (7.5) | C-2 (0.3) | W-1 (0.1) D-14 (0.2) | 6.5 | 0.10 | 5.2 |
| Comparative Example 1 | A-5 (95.6) | B-2 (4.0) | C-1 (0.3) | W-1 (0.1) | 15.5 | 0.11 | 10.5 |
| Comparative Example 2 | A-5 (95.75) | B-2 (4.0) | C-1 (0.15) | W-1 (0.1) | 8.0 | 0.15 | 13.5 |
| Comparative Example 3 | A-5 (94.6) | B-2 (5.0) | C-1 (0.3) | W-1 (0.1) | 12.0 | 0.11 | 9.0 |
| Comparative Example 4 | A-5 (78.6) | B-2 (21.0) | C-1 (0.3) | W-1 (0.1) | 5.0 | 0.14 | 11.5 |

In Table 1, the numeral in parentheses indicates the amount of the compound in terms of parts by weight based on 100 parts by weight of the total solid content of the resist composition.

As is apparent from the results shown in Table 1, the positive resist compositions of the present invention exhibit the high sensitivity, high resolution and excellent line edge roughness with respect to the pattern formation upon irradiation with electron beam in comparison with the resist compositions of the comparative examples.

<Evaluation with EUV Irradiation>

Examples 11 to 12 and Comparative Examples 5 to 6

Resist films were prepared in the same manner as in Example 1 using the respective resist compositions of Examples 1 and 9 and Comparative Examples 1 and 2. Each of the resulting resist films was subjected to open-frame-exposure with an EUV beam (wavelength: 13 nm) while varying the exposure amount by every 0.5 mJ in the range of from 0 to 5.0 mJ and then baked at 120° C. for 90 seconds. Thereafter, a dissolution rate at each exposure amount was measured using a 2.38% by weight tetramethylammonium hydroxide (TMAH) aqueous solution to obtain a sensitivity curve. In the sensitivity curve, the exposure amount at the time when the dissolution rate of the resist was saturated was defined as sensitivity, and a dissolution contrast (γ value) was determined from a gradient of the linear section of the sensitivity curve. The larger the γ value, the more excellent the dissolution contrast is.

The results are shown in Table 2 below.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive resist composition comprising (A) polysiloxane or polysilsesquioxane that has a property of increasing solubility in an alkali developing solution by the action of an acid and contains a group capable of being decomposed with an acid, (B) a compound that generates a sulfonic acid upon irradiation of an actinic ray or radiation, (C) an organic basic compound, and (D) a compound that generates a carboxylic acid upon irradiation of an actinic ray or radiation, wherein an amount of the compound that generates a sultonic acid upon irradiation of an actinic ray or radiation is from 6 to 20% by weight based on the total solid content of the positive resist composition, and the polysiloxane or polysilsesquioxane (A) has a structure represented by formula (1) shown below in the side chain thereof:

wherein, J1 represents an alkylene group; J2 represents an arylene group or a cycloalkylene group; J3 represents a group selected from —O—, —N(R$_1$)—, —COO—, —OC(=O)—, —O(C=O)—, —CON(R$_1$)—, —N(R$_1$)CO— and —NH—CO—NH—, in which R$_1$ represents a hydrogen atom or an alkyl group having

TABLE 2

| | Composition | | | | Evaluation Result | |
| --- | --- | --- | --- | --- | --- | --- |
| | | Component (B) | Component (C) | | | |
| | Component | Sulfonic | Organic | | | |
| | (A) Polymer | Acid Generator | Basic Compound | Other Component | Sensitivity (mJ/cm$^2$) | γ Value |
| Example 11 | A-5 (90.1) | B-2 (9.5) | C-1 (0.3) | W-1 (0.1) | 3.0 | 8.5 |
| Example 12 | A-21 (91.4) | B-2 (6.5) B-58 (1.5) | C-3 (0.3) | W-2 (0.1) D-13 (0.2) | 2.5 | 7.0 |
| Comparative Example 5 | A-5 (95.6) | B-2 (4.0) | C-1 (0.3) | W-1 (0.1) | >5.0 | 5.0 |
| Comparative Example 6 | A-5 (95.75) | B-2 (4.0) | C-1 (0.15) | W-1 (0.1) | 3.0 | 3.5 |

In Table 2, the numeral in parentheses indicates the amount of the compound in terms of parts by weight based on 100 parts by weight of the total solid content of the resist composition.

As is apparent from the results shown in Table 2, the positive resist compositions of the present invention are superior and exhibit the high sensitivity and high contrast with respect to the performance evaluation upon irradiation with EUV beam in comparison with the resist compositions of the comparative examples.

According to the present invention, a positive resist composition, which is excellent in sensitivity, resolution and line edge roughness with respect to pattern formation upon the irradiation of a high energy beam, for example, an electron beam, an X ray or an EUV beam, can be provided.

from 1 to 6 carbon atoms; J4 represents a divalent, trivalent or tetravalent connecting group; J5 represents a group capable of being decomposed by the action of an acid; m represents 1; k, l and n each independently represent 0 or 1; and p represents an integer of from 1 to 3.

2. The positive resist composition as claimed in claim 1, wherein an amount of the organic basic compound (C) is from 0.05 to 1.0% by weight based on the total solid content of the positive resist composition.

3. The positive resist composition as claimed in claim 1, wherein a light source for exposure is any one of an electron beam, an X ray and an EUV beam.

4. The positive resist composition as claimed in claim 1, which further comprises a fluorine-based and/or silicon-based surfactant.

5. The positive resist composition as claimed in claim 1, wherein the compound that generates a carboxylic acid upon irradiation of an actinic ray or radiation has a structure represented by the following formula (D):

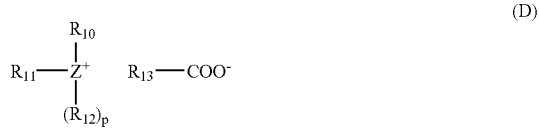

(D)

wherein $R_{10}$ to $R_{12}$ each independently represents an alkyl group, an alkenyl group or an aryl group; $R_{13}$ represents a hydrogen atom, an alkyl group, an alkenyl group or an aryl group; and Z represents a sulfur atom or an iodine atom, provided that in the case where Z represents a sulfur atom, p is 1; and in the case where Z represents an iodine atom, p is 0.

6. The positive resist composition as claimed in claim 1, wherein the ratio of the compound of Component (B)/the compound of Component (D) is 99.9/0.1 to 50/50 by weight.

7. The positive resist composition as claimed in claim 1, wherein the ratio of the compound of Component (B)/the compound of Component (D) is 99/1 to 60/40 by weight.

8. The positive resist composition as claimed in claim 1, wherein the ratio of the compound of Component (B)/the compound of Component (D) is 98/2 to 70/30 by weight.

* * * * *